United States Patent [19]

Kittle

[11] Patent Number: 6,090,217
[45] Date of Patent: Jul. 18, 2000

[54] SURFACE TREATMENT OF SEMICONDUCTOR SUBSTRATES

[76] Inventor: Paul A. Kittle, P.O. Box 707, Concordville, Pa. 19331

[21] Appl. No.: 09/208,112

[22] Filed: Dec. 9, 1998

[51] Int. Cl.[7] ............................... B08B 3/00; B08B 5/00
[52] U.S. Cl. .............................. 134/11; 134/17; 134/21; 134/31
[58] Field of Search ............................... 134/2, 22.18, 31, 134/36, 22.19, 21, 11, 17

[56] References Cited

U.S. PATENT DOCUMENTS

| | | | |
|---|---|---|---|
| 3,037,887 | 6/1962 | Brenner et al. | 134/22 |
| 3,212,762 | 10/1965 | Carroll et al. | 261/124 |
| 3,436,262 | 4/1969 | Crowe et al. | 134/10 |
| 4,133,773 | 1/1979 | Simmons | 252/359 |
| 4,817,652 | 4/1989 | Liu et al. | 134/102 |
| 4,849,027 | 7/1989 | Simmons | 134/22.18 |
| 4,962,776 | 10/1990 | Liu et al. | 134/11 |
| 5,968,202 | 10/1999 | Verbiest et al. | 8/137 |

Primary Examiner—Randy Gulakowski
Assistant Examiner—Saeed Chaudhry
Attorney, Agent, or Firm—Howson & Howson

[57] ABSTRACT

Surface cleaning, chemical treatment and drying of semiconductor substrates is carried out using foam as a medium instead of a condensed phase liquid medium. In cleaning and chemical treatment, by introducing a foam into an overflow vessel the foam is caused to pass over the substrate in moving contact therewith. Drying of the substrate is carried out, using a water solution of carbon dioxide in a pressurizable vessel. By releasing the pressure in the vessel, a layer of foam is established on the surface of the solution. The solution is discharged from the vessel, causing the foam layer to pass over the substrate in moving contact therewith. The carbon dioxide reduces the surface tension of the water, thereby enabling the foam layer to be produced and also assisting in the elimination of water from the surface of the substrate. In both cases, the use of foam reduces materials requirements and also reduces the quantity of particles deposited onto the substrate in the treatment process.

12 Claims, 14 Drawing Sheets

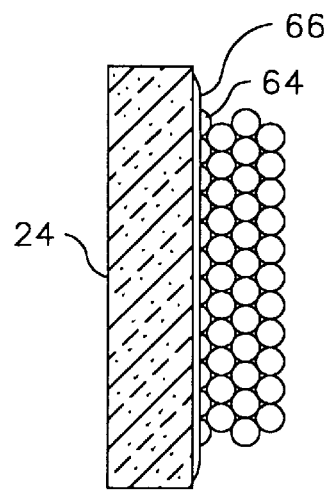
Fig. 4
Fig. 5(a)   Fig. 5(b)   Fig. 5(c)
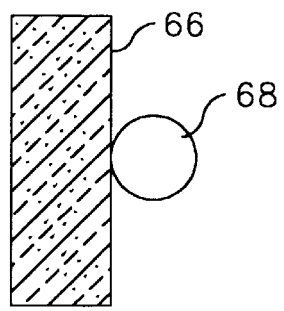   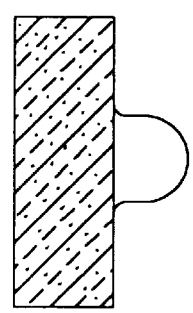   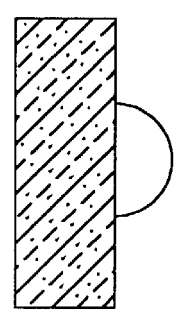
Fig. 5(d)   Fig. 5(e)   Fig. 5(f)
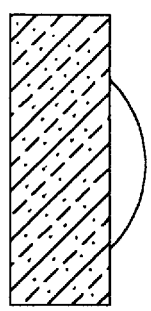   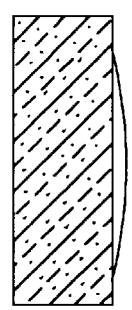   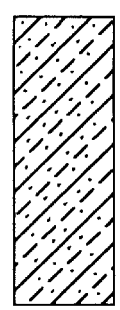

SURFACE TREATMENT OF SEMICONDUCTOR SUBSTRATES

BACKGROUND OF THE INVENTION

This invention relates generally to the treatment of the surfaces of devices, especially semiconductor wafers and other electronic or electro-optical devices, at various stages of production. It relates more particularly to novel cleaning, chemical treatment and drying processes in which, instead of a condensed phase medium (liquid), a foam is used as a medium for the various operations such as cleaning, etching, neutralization and drying.

Semiconductor cleaning, chemical treatment and drying technology is well-developed. Examples of known processes are those described in U.S. Pat. No. 4,781,764, dated Nov. 1, 1988, U.S. Pat. No. 4,911,761, dated Mar. 27, 1990, U.S. Pat. No. 5,271,774, dated Dec. 21, 1993 U.S. Pat. No. 5,656,097, dated Aug. 12, 1997 and U.S. Pat. No. 5,571,337, dated Nov. 5, 1996. However, cleaning, chemical treatment and drying of semiconductors is very expensive. Moreover, performance requirements will soon exceed the present and expected capabilities of current cleaning techniques.

Current processes for the cleaning and treatment of semiconductor wafers and other electronic devices have several serious drawbacks from the standpoint of cost, safety and effectiveness.

High purity deionized water is typically used as a solvent. However, achieving the necessary high purity levels is very expensive. Indeed, all phases of the cleaning operation, including purchasing, transportation, storage, internal distribution, consumption, and disposal, are expensive.

Most of the substances used in the cleaning and chemical treatment processes, such as fluorides, solvents, acids, heavy metals, oxidizers, etc., are toxic, flammable, or otherwise hazardous or obnoxious.

Chemical treatment and cleaning operations are also major sources of chemical contamination of the final product. Such contamination results from errant surface reactants, and physical contamination by undesired, very small solid particles. These very low levels of contaminants are delivered to the product, in part from the chemical treating and cleaning materials themselves, even though they are ultrapure. They are also delivered to the product from fittings, piping, tanks, valves, and other components of storage and delivery systems.

Contaminants on semiconductor wafer surfaces exist as films, discrete particles or groups of particles and adsorbed gases. Surface films and particles can be classified as molecular compounds, ionic materials and atomic species. Molecular compounds are mostly particles or films of condensed organic vapors from lubricants, greases, photoresists, solvent residues, organic components from deionized water or plastic storage containers, and metal oxides or hydroxides. Ionic materials comprise cations and anions, mostly from inorganic compounds that may be physically adsorbed or chemically bonded, such as ions of sodium, fluorine and chlorine. Atomic or elemental species comprise metals, such as gold and copper, that may be chemically bonded to the semiconductor surface, or they may consist of silicon particles or metal debris from equipment.

Semiconductor devices, especially dense integrated circuits, are vulnerable to all of these contamination sources. The sensitivity is due to the small feature sizes and the thinness of the deposited layers on the wafer surface. These dimensions are in the submicron range. The small physical dimensions of the devices make them very vulnerable to particulate contamination in the air, from workers, generated by the equipment, and present in processing chemicals. As the feature size and films become smaller, the allowable particle size must be controlled to smaller dimensions. In general, the particle size should be 10 times smaller than the minimum feature size. Currently, the minimum feature size for commonly available semiconductor chips is $0.25\mu$, therefore suggesting particle control to $0.025\mu$.

Conventional cleaning technologies, utilizing condensed phase solutions, when properly applied, remove a majority of the contaminants generated during the chemical processing of the semiconductor wafers. Liquid systems currently in use can delivery satisfactory results, and acceptable product can be produced. However, the current trend is to require the chemical and equipment suppliers to provide increasingly clean performance. Equipment and chemical suppliers are facing tremendous performance challenges as the feature size decrease. At the same time, semiconductor manufacturers do not want their costs to increase.

Another problem addressed by this invention is the drying of surfaces in the production of semiconductor wafers and similar devices.

Semiconductor wafers are not manufactured in a continuous process. Since there are many semiconductor wafer configurations, batches of wafers are processed through certain steps, then stored. Later the batches are subjected to additional processing steps, and again stored. The processing and storage sequence may be repeated several times before processing is completed.

In general, at the end of each process sequence, the semiconductor wafers are dried, often even when the next step will proceed almost immediately. Wafers can be transported from one process sequence to the next only after they have been dried, and they can only be stored safely when they are dry. Therefore, the drying process is carried out frequently in the processing of a given wafer, and is very important.

Recently, isopropyl alcohol has become a preferred drying solvent. A variety of processes have been developed and commercialized using isopropyl alcohol either hot or cold, and as a vapor, a liquid or a combination of vapor and liquid. Semiconductor wafer producers have been moving toward reduced isopropyl alcohol usage because of its cost, fire hazards, disposal problems, and VOC (volatile organic compound) emissions.

U.S. Pat. No. 4,911,761, dated Mar. 27, 1990, describes semiconductor wafer processing in which various fluids passed over wafers in fixed positions. The drying sub-system utilizes superheated isopropyl alcohol vapor generated in a distillation apparatus.

U.S. Pat. No. 5,271,774, dated Dec. 21, 1993 describes a technique for removing water from a semiconductor wafer using low levels of solvents such as isopropyl alcohol, applied as a vapor, to reduce the surface tension of a film of liquid on the substrate, and thereby reduce the quantity of material remaining on the surface of the substrate. A centrifuge is used to facilitate the removal of the liquid film.

U.S. Pat. No. 5,571,337 describes another technique for drying semiconductor wafers, utilizing a trace amount of a polar organic compound in a carrier gas composed of oxygen, nitrogen, argon, or mixtures. This patent describes the drying of wafers without the use of isopropyl alcohol, using only warm nitrogen gas.

Thus, the industry has proceeded from the use of large quantities of isopropyl alcohol, to minimal quantities of isopropyl alcohol, and then to processes which use no isopropyl alcohol at all.

The principal objects of this invention are to increase the effectiveness of chemical treatment, cleaning and drying operations, and to reduce the cost of such operations. Further objects of the invention are to improve the safety of the chemical treatment, cleaning and drying operations and to reduce the discharge of hazardous or obnoxious substances from the treating and cleaning operations.

SUMMARY OF THE INVENTION

Briefly, the invention takes advantage of a desirable characteristic of a foam, namely that, from a volumetric standpoint, a given quantity of foam consists mostly of gas. Therefore the quantity of small particles delivered to a substrate by the liquid component of the foam is much smaller than the quantity of particles delivered to a substrate by an equivalent volume of a liquid.

The expansion ratio of a foam, i.e. the volume of the foam divided by the volume of its liquid component, defines the cost and performance benefit available from the use of foam. For example, if the expansion ratio is 10, the volume of liquid is reduced to 1/10 of the volume of liquid to which the substrate is exposed in a condensed phase chemical treatment or cleaning step. This not only achieves a theoretical materials cost reduction of 90% but also reduces the quantity of contaminating particles delivered to the substrate by a factor of 10. A small increase in the expansion ratio results in a relatively large overall benefit. Additional cost savings can be obtained as a result of the reduction in the volume of the cleaning medium. The resulting smaller inventory of cleaning medium, and the size reductions that can be achieved in components such as tanks, valves, pipes, pumps, etc., lead to lower floor space requirements, which, for semiconductor fabrication facilities, is very significant.

In accordance with one aspect of the invention, the treatment, i.e. cleaning or chemical treatment, of a semiconductor substrate is carried out by the steps of generating a foam consisting of gas bubbles and a liquid component, and causing the foam to pass over the substrate while in moving contact therewith.

In accordance with another aspect of the invention, a semiconductor substrate is dried by a process comprising the steps of generating a foam consisting of carbon dioxide bubbles and deionized water, and causing the foam to pass over the substrate in moving contact therewith.

The cleaning or chemical treatment steps, and the drying step can be carried out in the same treatment vessel. The cleaning, chemical treatment and drying steps can be carried out in sequence without removing the substrate from the treatment vessel.

Other features of the invention are applicable not only to the cleaning, chemical treatment and drying of semiconductor substrates, but also to the cleaning, chemical treatment and drying of other substrates where the removal of extremely small particles or other contaminants, or avoidance of their deposition onto the substrate, is important.

Preferably, the semiconductor substrate is supported in a foam treatment vessel, the foam is generated outside the foam treatment vessel and introduced into the foam treatment vessel, and foam in contact with the semiconductor substrate is caused to pass over the substrate as a result of its displacement by foam introduced into the foam treatment vessel. A sufficient quantity of foam may be introduced to fill the treatment vessel and thereafter, by continued introduction of foam into the treatment vessel, foam may be caused to discharge from the treatment vessel.

For cleaning the substrate, the liquid component of the foam may consist of a surface tension-reducing agent and deionized water, and the movement of the foam removes particles from the substrate. For chemical treatment of the substrate, the liquid component of the foam may include one or more reactants, such as ammonium hydroxide, hydrofluoric acid, nitric acid, etc., so that a chemical reaction takes place between the substrate and the reactant as the foam passes over the substrate. The reactants themselves may serve as surface tension-reducing agents. However, ordinarily, since the reactants will be present in insufficient concentrations to produce adequate quantities of foam, conventional surfactants or other additional surface tension-reducing agents will be included along with the reactants.

In a preferred embodiment, the foam introducing step is carried out by first introducing a foam consisting essentially of a surface tension-reducing agent and deionized water, thereafter introducing a foam comprising deionized water, a surface tension-reducing agent and at least one reactant for chemical treatment of the substrate whereby a chemical reaction takes place between the substrate and the reactant, and thereafter introducing a foam consisting essentially of a surface tension-reducing agent and deionized water, whereby said at least one reactant is rinsed from the substrate.

A foam-based cleaning system in accordance with the invention can effectively substitute for a liquid phase system using sonic energy.

The process may be carried out by alternately introducing a foam consisting essentially of a surface tension-reducing agent and deionized water, and a foam comprising a surface tension-reducing agent, deionized water and at least one reactant for chemical treatment of the substrate. By carrying out the process in this manner, a series of chemical treatment steps can be carried out on a semiconductor substrate, all using foam as a vehicle for the reactants.

In accordance with another aspect of the invention, for drying the substrate, the foam treatment vessel is preferably located within a pressurizable containment vessel. The substrate is submerged in a solution of carbon dioxide in deionized water under pressure, and thereafter a foam is generated by reducing the pressure within the containment vessel. The pressure reduction causes carbon dioxide bubbles to form a foam layer on the surface of the solution. Thereafter the foam layer is caused to pass over the substrate in moving contact therewith by discharging the solution from the foam treatment vessel.

Other objects and advantages of the invention will be apparent from the following detailed description.

BRIEF DESCRIPTION OF THE DRAWINGS

FIG. 4 is a schematic diagram illustrating the wetting of a semiconductor substrate by a mass of foam;

FIGS. 5(a)–5(f) are schematic diagrams illustrating successive stages in the wetting of a substrate by a foam bubble;

DETAILED DESCRIPTION

The physical and chemical conditions prevailing in the cleaning of semiconductor wafers lend themselves to easy and simple foaming performance optimization. The solvent system is extremely pure water, and therefore no minerals or hardness are present to interfere with foaming. The temperature can be readily adjusted to optimize foaming behavior. (Foaming is always better in warmer water because the surface tension decreases as the temperature increases.) The required persistence of the foam medium is generally less than one or two minutes. Accordingly, it is possible to use very fast-draining foams. In fact the use of fast-draining foams is desirable so that the foam self-destructs, avoiding the need for additional measures to remove it.

Foams are metastable and are formed by adding energy to a gas/liquid combination. As soon as the agitation, or mixing, force is removed the foam will start draining, thereby providing a liquid phase essentially identical to that provided in a condensed phase, all liquid, system. Therefore, for any liquid system shown to be an effective cleaning medium, a corresponding foam system will perform identically, because the surface layer composition, next to the semiconductor wafer, will be the same in both cases.

The significance of the use of foam in semiconductor surface cleaning technologies is that a foam-based cleaning system is capable of removing more particles than it generates. In contrast, with a condensed phase liquid system, the particle count potentially increases in successive processing steps, yielding potentially unsatisfactory final results.

Figure 1:
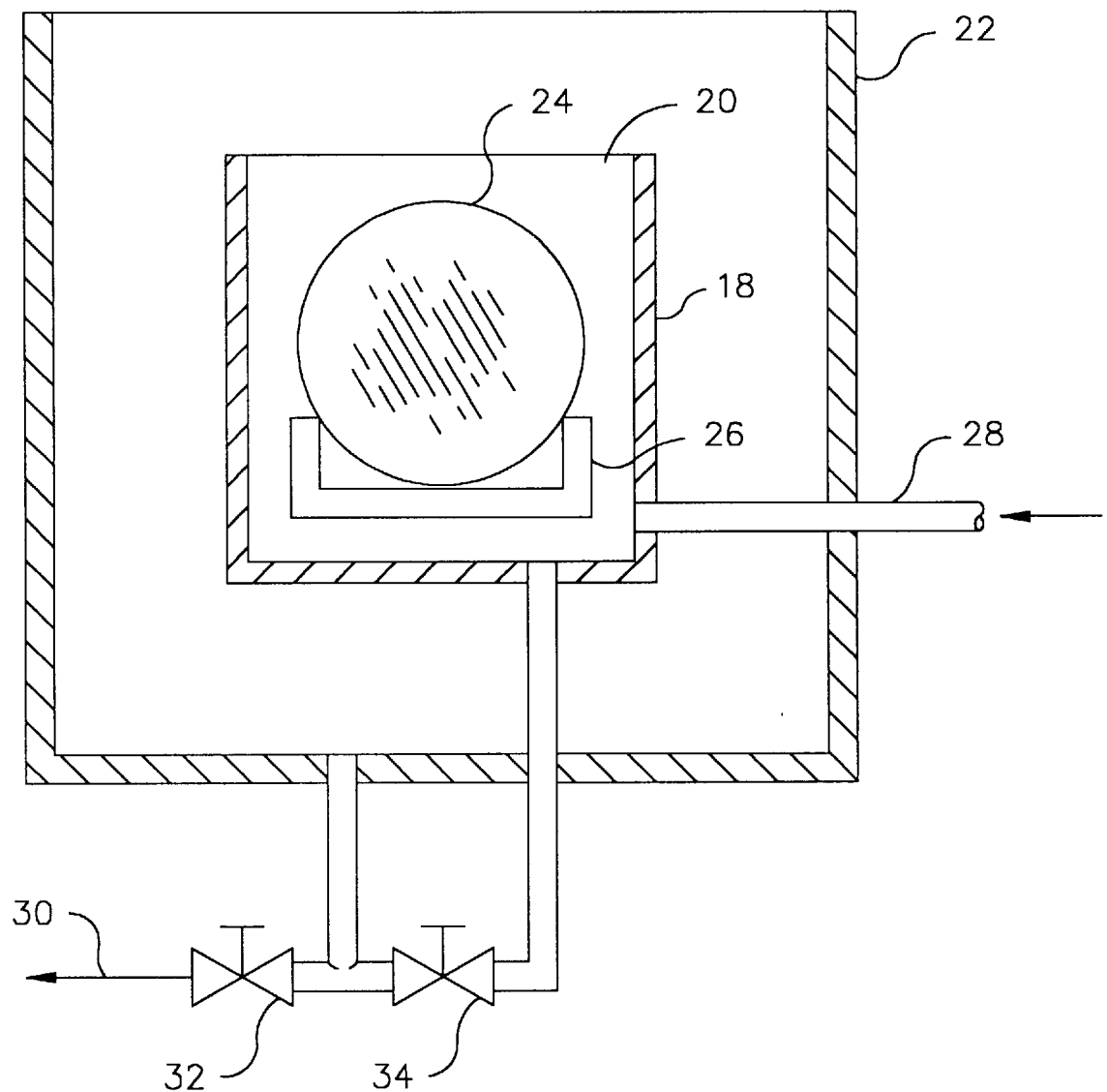
FIG. 1 is a schematic diagram of a treatment apparatus for cleaning or chemically treating a semiconductor substrate, in accordance with the invention.

The apparatus depicted in FIG. 1 is used for cleaning and chemically treating a substrate. It comprises an inner vessel 18 having a top opening 20, located within an outer vessel 22, which is also open at the top. A substrate 24 is supported within vessel 18 on a supporting frame 26. The substrate is typically a semiconductor substrate such as a silicon wafer, either in the raw state or at one of the many stages in the fabrication process. Although only one wafer is shown, it should be understood that, in a wafer cleaning or chemical treatment operation, the support frame may carry a large number of wafers.

A foam inlet line 28 is connected to the interior of vessel 18 at or near the bottom of the vessel. A discharge line 30 is connected to the bottom of the outer vessel 22 through a valve 32, and to the bottom of the inner vessel 18 through valves 32 and 34 in series.

Figure 3:
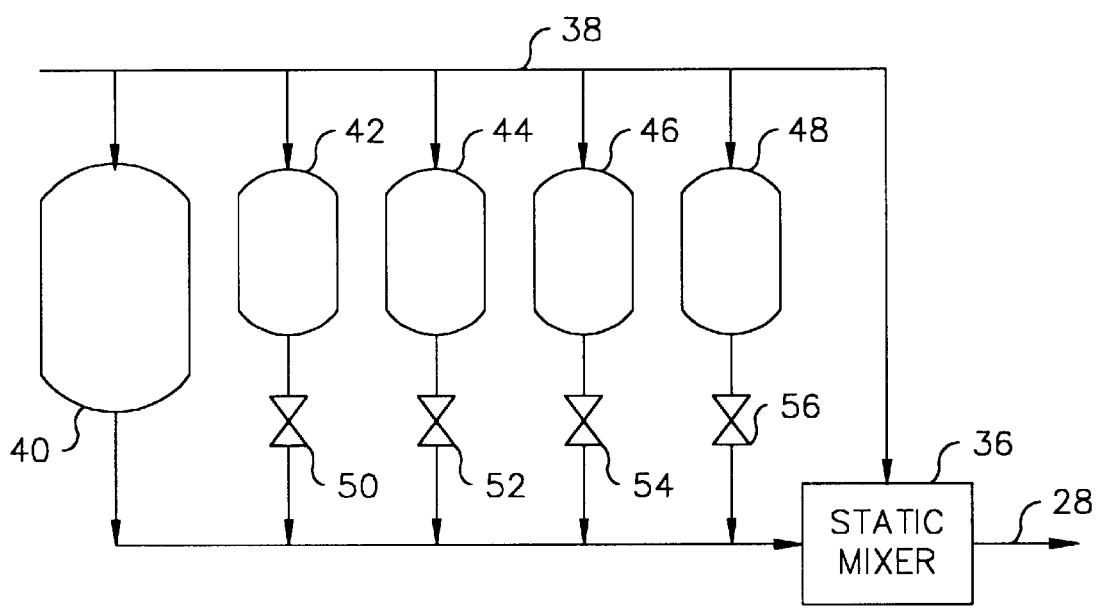
FIG. 3 is a schematic diagram of a chemical feed and foam generating system for use with the treatment apparatus of FIGS. 1 and 2.

The foam inlet line 28 carries a foam into the inner vessel from a static mixer 36 shown in FIG. 3. The static mixer can be any of a variety of known devices used to produce foam by mixing a gas with a liquid containing a surface tension-reducing agent. Suitable static mixers are described in U.S. Pat. No. 4,400,220, dated Aug. 23, 1983 and U.S. Pat. No. 5,133,991, dated Jul. 28, 1992. A suitable surface tension-reducing agent is a nonionic surfactant available from Wako Chemical of Richmond, Va. under number NCW-601A. A wide variety of substances can be used as surface-tension reducing agents for the purpose of forming foams in deionized water. These include conventional surfactants, i.e. soaps and detergents of course, but also include a wide range of other substances such as isopropyl alcohol, nitrous oxide, isobutane, and carbon dioxide. The concentration of the surface tension-reducing agent should be sufficiently low to provide a fast drain time since, as will be apparent, it is important to avoid filling the outer vessel with foam. In the case of conventional surfactants, the appropriate concentration is typically in the range of 100 ppm. to 2000 ppm. For isopropyl alcohol, the concentration will typically be in the range of 1.0%. Various other solutes, including reactants such as ammonium hydroxide, nitric acid, hydrofluoric acid, etc. are normally used in concentrations too low to produce effective foams, and need to be supplemented by other surface tension reducing agents such as conventional surfactants.

As shown in FIG. 3, a gas supply line 38 delivers a gas to the static mixer 36 and also to liquid supply tanks 40, 42, 44, 46 and 48. The gas pressure is thus used to drive liquids from the tanks into the static mixer. The gas can be any of many suitable gases, including nitrogen, argon, air, carbon dioxide and other gases. In general, nitrogen is preferred.

Tank 40 contains a solution consisting of a surface tension-reducing agent in deionized water. Tanks 42–48 hold a variety of reactants used for chemical treatment of the substrates. Examples of such reactants are cleaning mixtures such as solutions of ammonium hydroxide and hydrogen peroxide in deionized water, and etchants such as solutions of hydrofluoric acid in water. Valves 50, 52, 54 and 56 control the flow of reactants from the reactant supply tanks so that the reactants can be supplied selectively to the static mixer along with the solution of surface tension-reducing agent.

Figure 2:
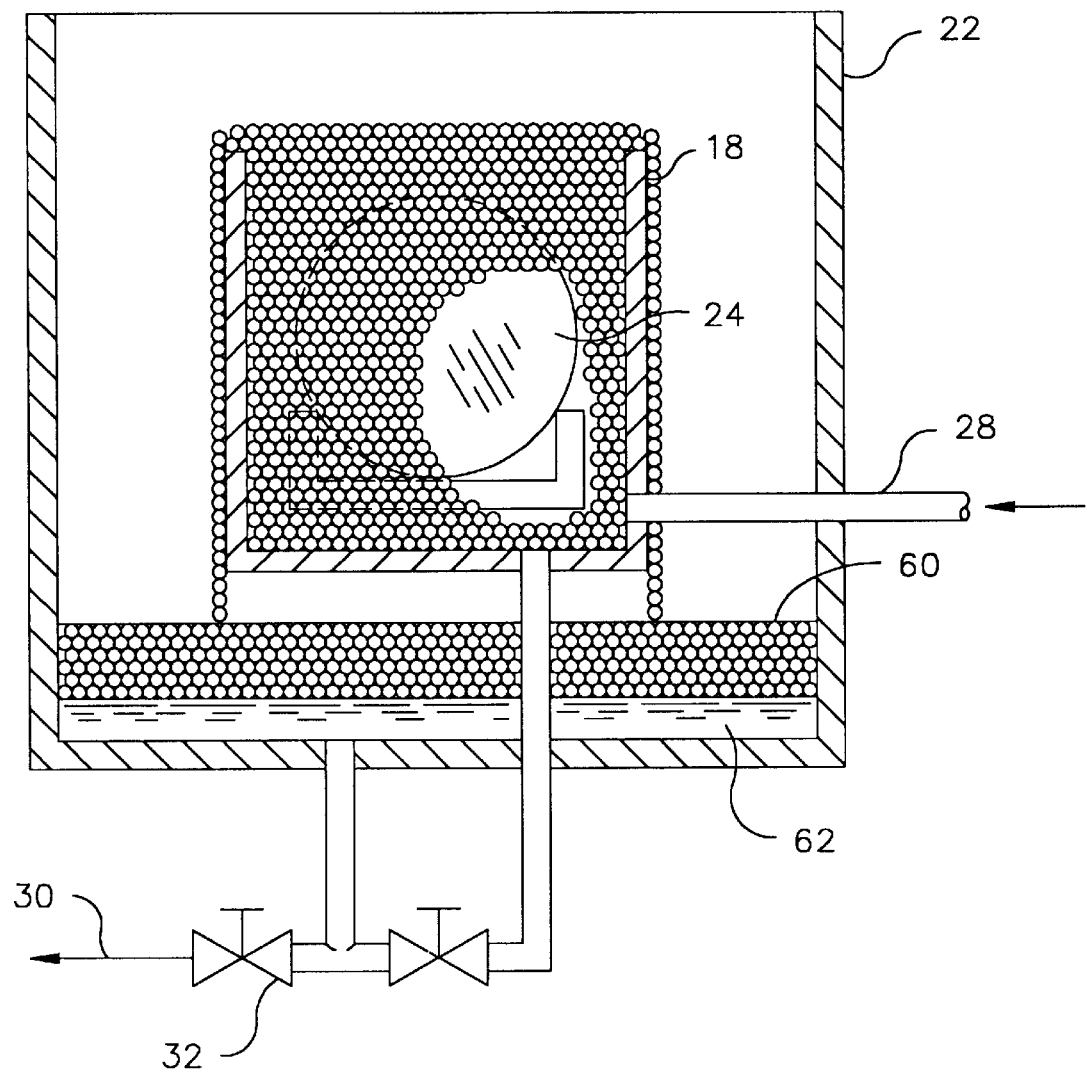
FIG. 2 is a schematic diagram showing the treatment apparatus in operation.

As shown in FIG. 2, foam is introduced through the foam inlet line 28 until the inner vessel 18 is filled, and then continued introduction of foam causes excess foam to overflow the inner vessel and drop into the outer vessel. The foam is relatively short-lived, and the layer 60 in the lower portion of the outer vessel 22 quickly drains, forming a layer 62 of liquid, which is carried off though valve 32 to discharge line 30.

The introduction of foam into vessel 18 causes the foam within the vessel to rise continuously so that it passes over the substrate 24 in moving contact with the substrate.

As shown in FIG. 4, the foam bubbles 64 adjacent the surface 66 of the substrate are draining. As shown in FIG. 5(a), when a bubble 68 approaches the surface 66, and the bubble has not yet wetted the surface, the surface is dry. However, as shown in FIG. 5(b), as soon as the bubble contacts the surface, it almost immediately wets the surface over an area approximately equivalent to the cross-section of the original bubble through its center. FIGS. 5(c)–5(f) show that, as the bubble drains, the wetted area gradually increases until the bubble is fully drained as in FIG. 5(f). The mass of bubbles, as shown in FIG. 4, forms a continuous film on the surface 64 of the substrate.

As the mass of bubbles moves across the surface of the substrate, particles are scrubbed from the surface. Thus, if the foam consists only of deionized water and surface tension-reducing agent, it serves to clean the substrate. On the other hand, if the foam also includes a reactant, it not only removes any remaining particles from the surface, but also delivers a film of reactant to the surface. In both cases, the quantity of particles delivered to the surface of the substrate by the foam itself is far lower than the quantity that would be delivered by a liquid in a cleaning or chemical treatment operation.

The fast drain time of the foam is important not only in order to prevent the outer vessel from filling with foam, but also in order to allow the reactant to be applied to the substrate in a liquid phase.

While in the treatment vessel 18, the substrate can be exposed to a series of cleaning and chemical treating steps. For example, the substrate may be cleaned by first introducing a foam consisting essentially of a surface tension-reducing agent and deionized water. Thereafter, by opening the appropriate valve in the chemical feed and foam generating system of FIG. 3, a foam comprising a surface tension-reducing agent, deionized water and a reactant is introduced in order to effect a chemical reaction, e.g. chemical cleaning, on the surface of the substrate. Thereafter, the flow of the reactant is cut off, and the reactant is rinsed from the surface of the substrate by a foam once again consisting essentially of the surface tension-reducing agent and deionized water. The rinsing step may be followed by another chemical treatment step, e.g. etching, carried out by opening an appropriate valve in FIG. 3 to introduce an etchant into the static mixer along with the surface tension-reducing agent solution so that the foam film in contact with the substrate applies the etchant to the substrate. Chemical treatment and rinsing steps may be carried alternately in an extended sequence of steps in which the reactants are different in the successive reactant introduction steps.

The use of foam not only reduces the quantity of particles delivered to the surface of the substrate in the cleaning and chemical treatment process, but also reduces the quantity of reactants needed to carry out chemical treatment.

The drying process utilizes a carbon dioxide solution in deionized water. Carbon dioxide has a number of desirable properties which make it ideal for use in a foam drying process. It is inexpensive, readily available, water soluble, and non-flammable. It is also non-toxic, causes no VOC emissions, and a water solution of carbon dioxide can be disposed of in a conventional sanitary sewer without special treatment or other precautions. Although a solution of carbon dioxide in water forms carbonic acid ($H_2CO_3$), the level of carbonic acid formed is very low, and it has little, if any, effect on the pH of the solution. In water, carbon dioxide serves as a surface tension reducing agent, thereby allowing foaming.

Figure 6:
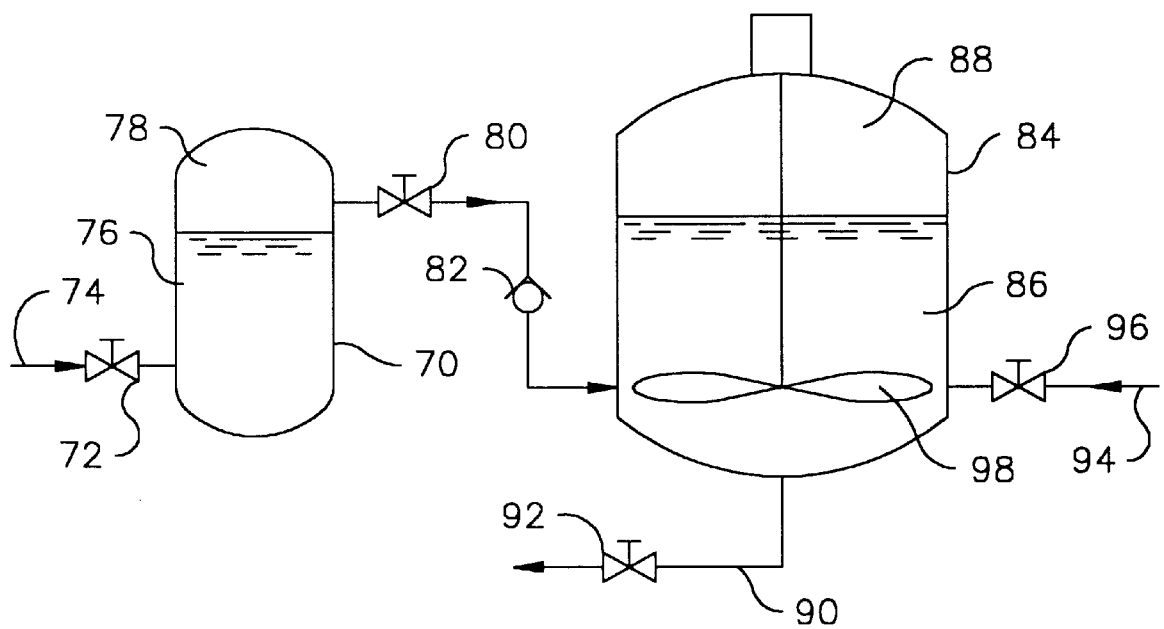
FIG. 6 is a schematic diagram of an apparatus for supplying a solution of carbon dioxide in deionized water for drying a substrate.
Figure 7:
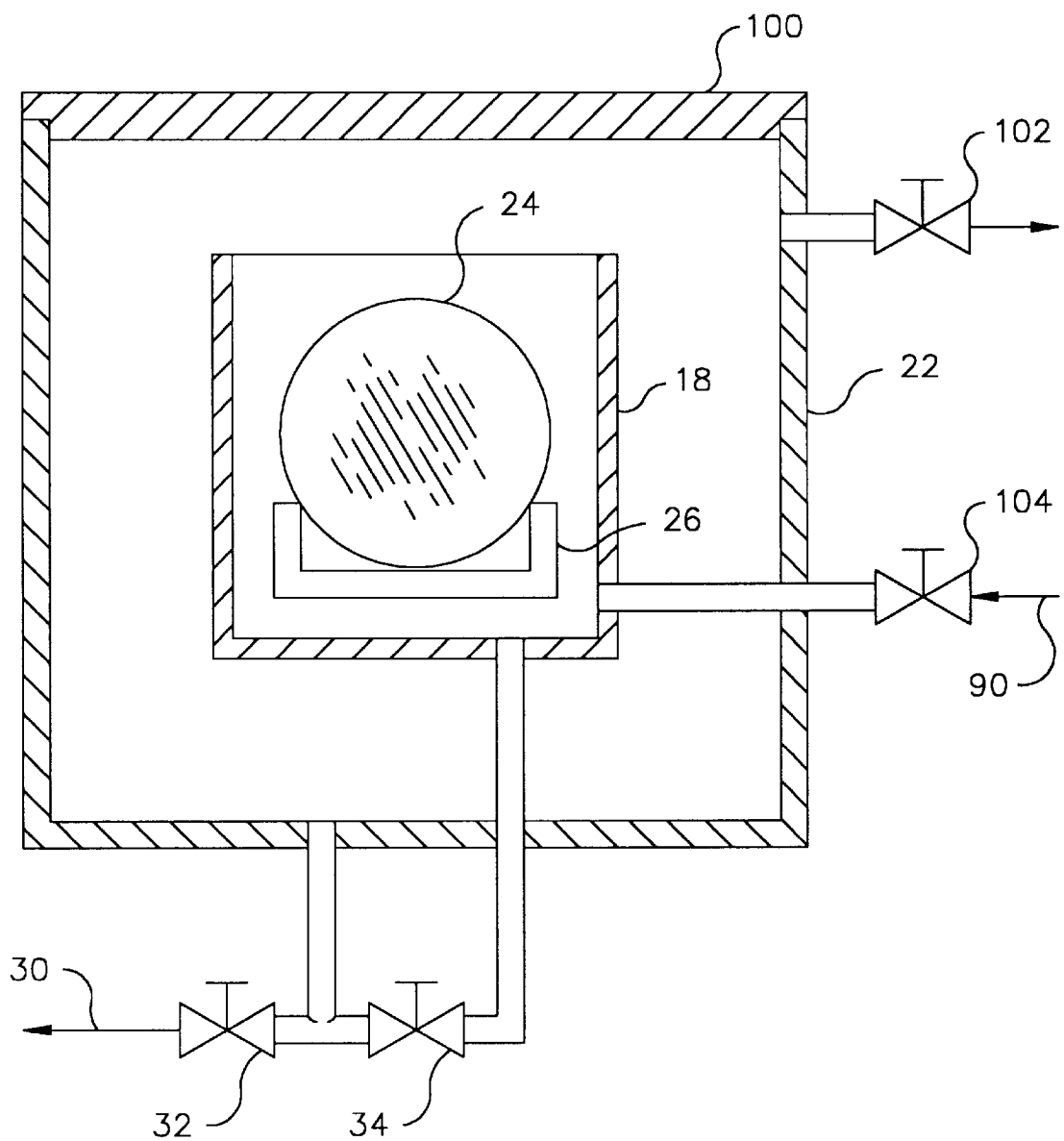
FIG. 7 is a schematic diagram of an apparatus for drying a semiconductor substrate, in accordance with the invention.

The carbon dioxide solution is generated by the apparatus shown in FIG. 6. Carbon dioxide is maintained under pressure in a tank 70, which is refilled from time to time through a valve 72 in inlet line 74. In tank 70, carbon dioxide is present in the liquid phase at 76 and in the gaseous phase at 78. The gaseous carbon dioxide is fed, through valve 80 and check valve 82, to a tank 84, where it is dissolved in deionized water to form a solution 86. The solution has a layer 88 of gaseous carbon dioxide above it, which is under pressure. The pressure of this layer of gaseous carbon dioxide is used to discharge the solution, through line 90 and valve 92, to a drying apparatus. Deionized water is replenished through line 94 and valve 96, and the solution is kept in motion by agitator 98 to maintain homogeneity.

The carbon dioxide solution is delivered through line 90 to the apparatus shown in FIGS. 7–10. The apparatus of FIGS. 7–10 can be the same apparatus as depicted in FIG. 1, but is provided with a top closure 100, allowing the outer vessel to be pressurized, a pressure control valve 102 for controlled venting of pressure within the outer vessel, and a valve 104, which can be closed after the carbon dioxide solution is fed into the inner vessel 18.

Figure 8:
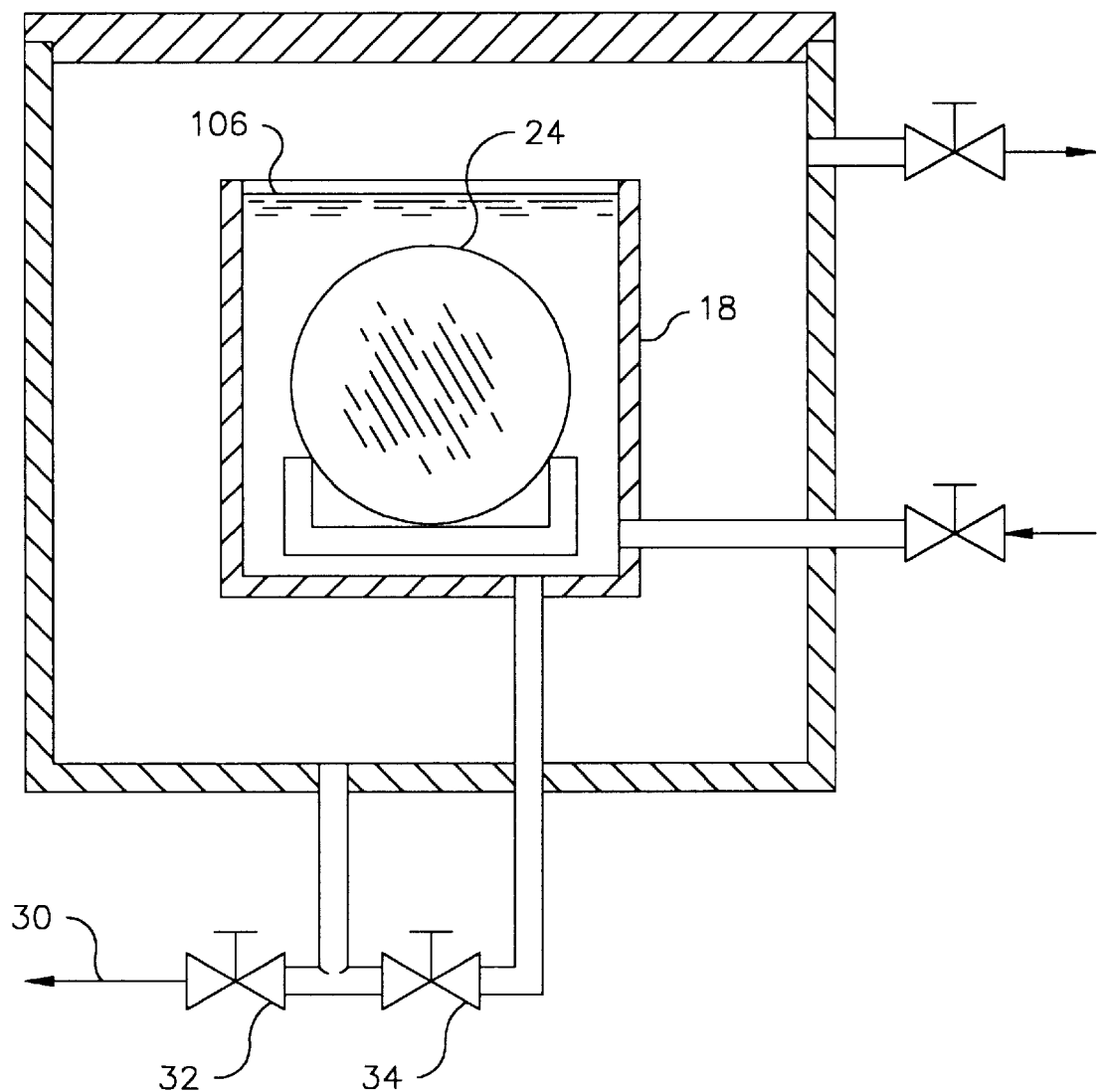
FIGS. 8–10 are schematic diagrams illustrating successive stages in the drying process using the drying apparatus of FIG. 7.

In the drying operation, the inner vessel 18 is filled with carbon dioxide solution through valve 104 while the pressure control valve 102 is either closed, or only partly opened, in order to prevent carbon dioxide bubbles from being released from the solution as it fills the inner vessel 18. As shown in FIG. 8, the carbon dioxide solution fills the inner vessel to a level 106, above the uppermost part of the substrate 24.

Figure 9:
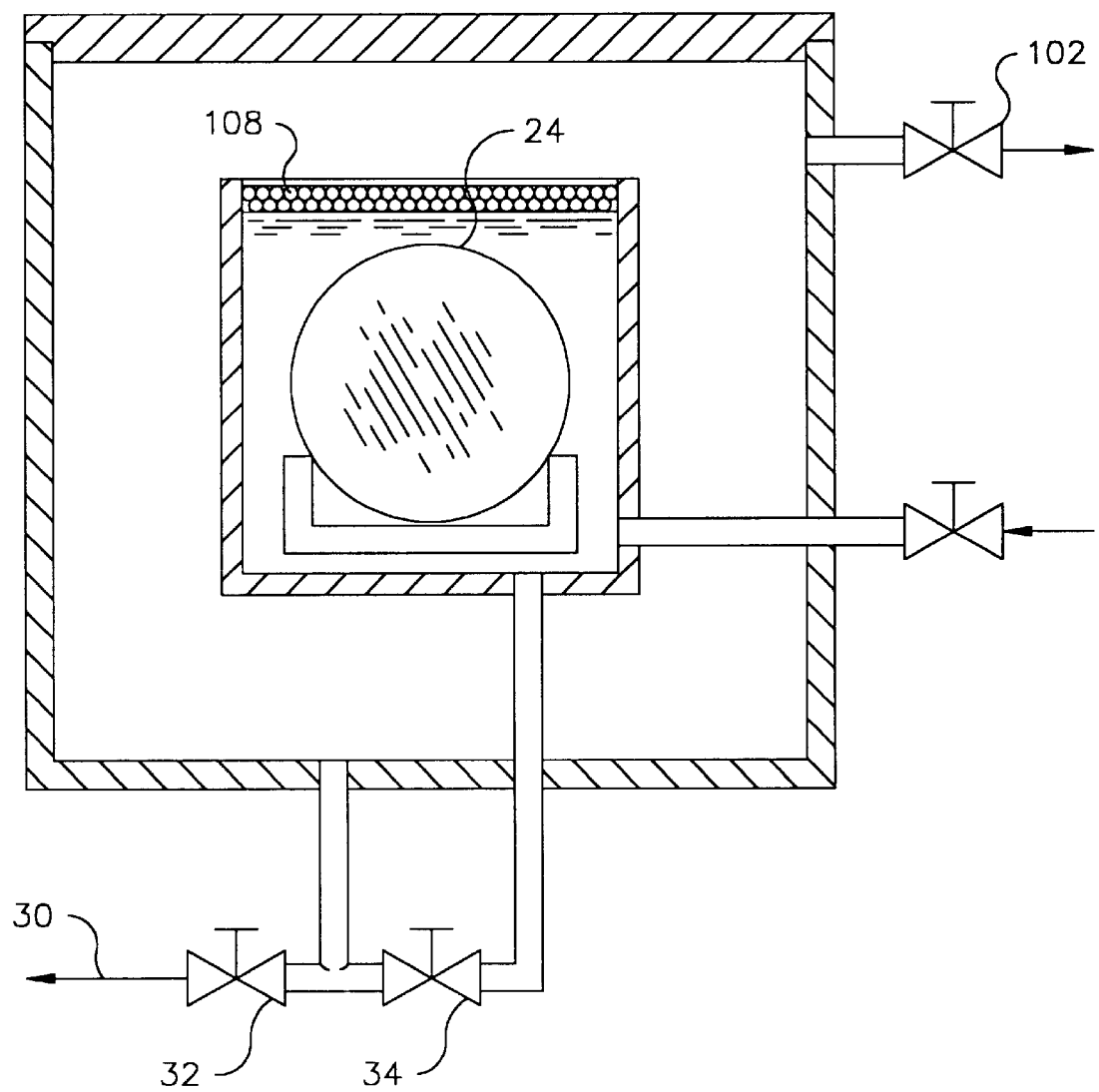

After filling the inner vessel 18, valve 102 is opened in a controlled manner to relieve the pressure within the outer vessel. The relieving of the pressure causes carbon dioxide bubbles to be released from the solution. These bubbles form a layer 108 of foam on the surface of the solution as shown in FIG. 9.

Figure 10:
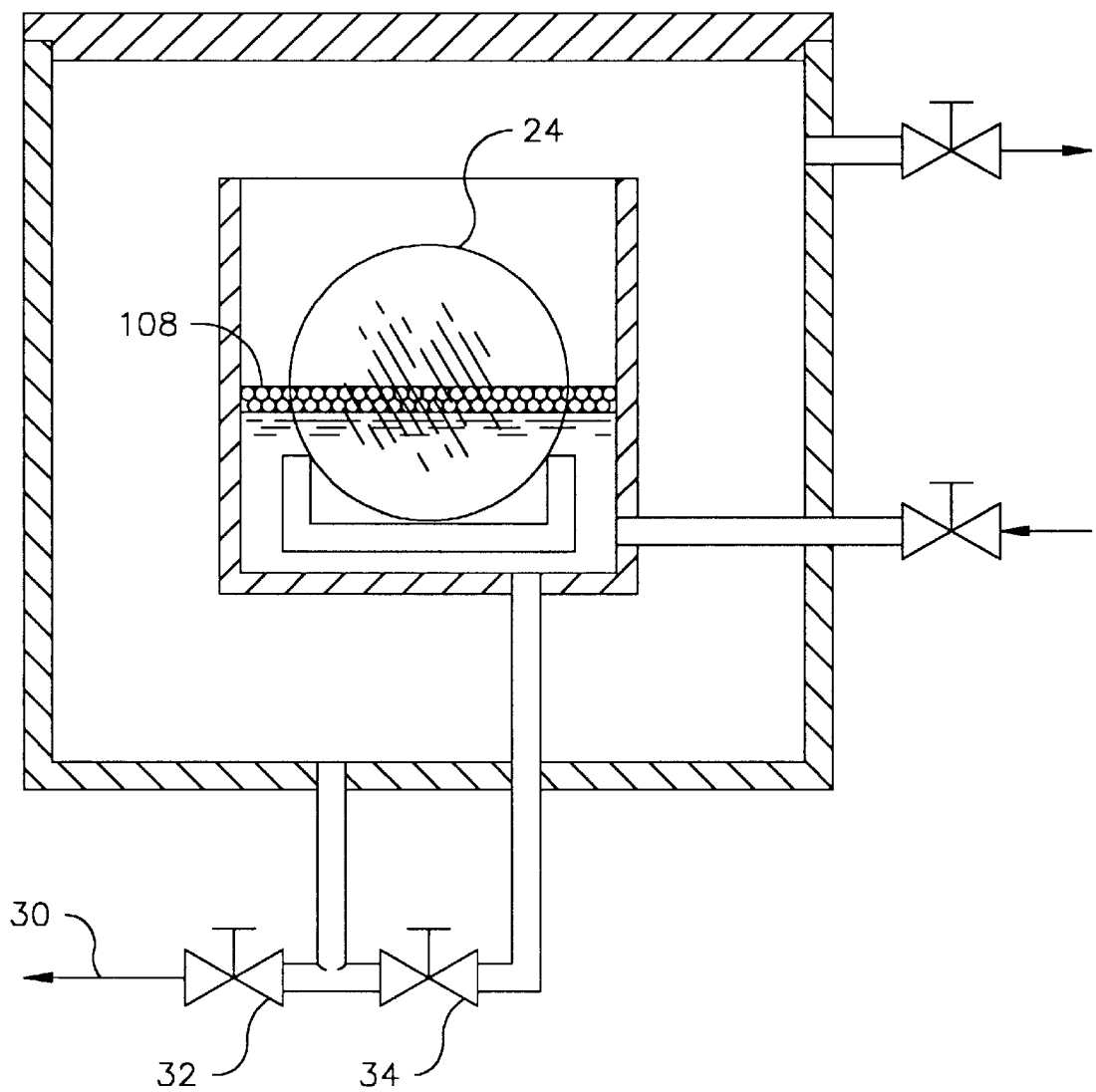

Promptly after the layer of foam is formed, valves 34 and 32 are opened to discharge the carbon dioxide solution from the inner vessel through line 30. The discharge takes place by gravity, but may be assisted by residual gas pressure within the enclosure. The foam layer 108 descends, as shown in FIG. 10, passing downwardly over the substrate.

Figure 11:
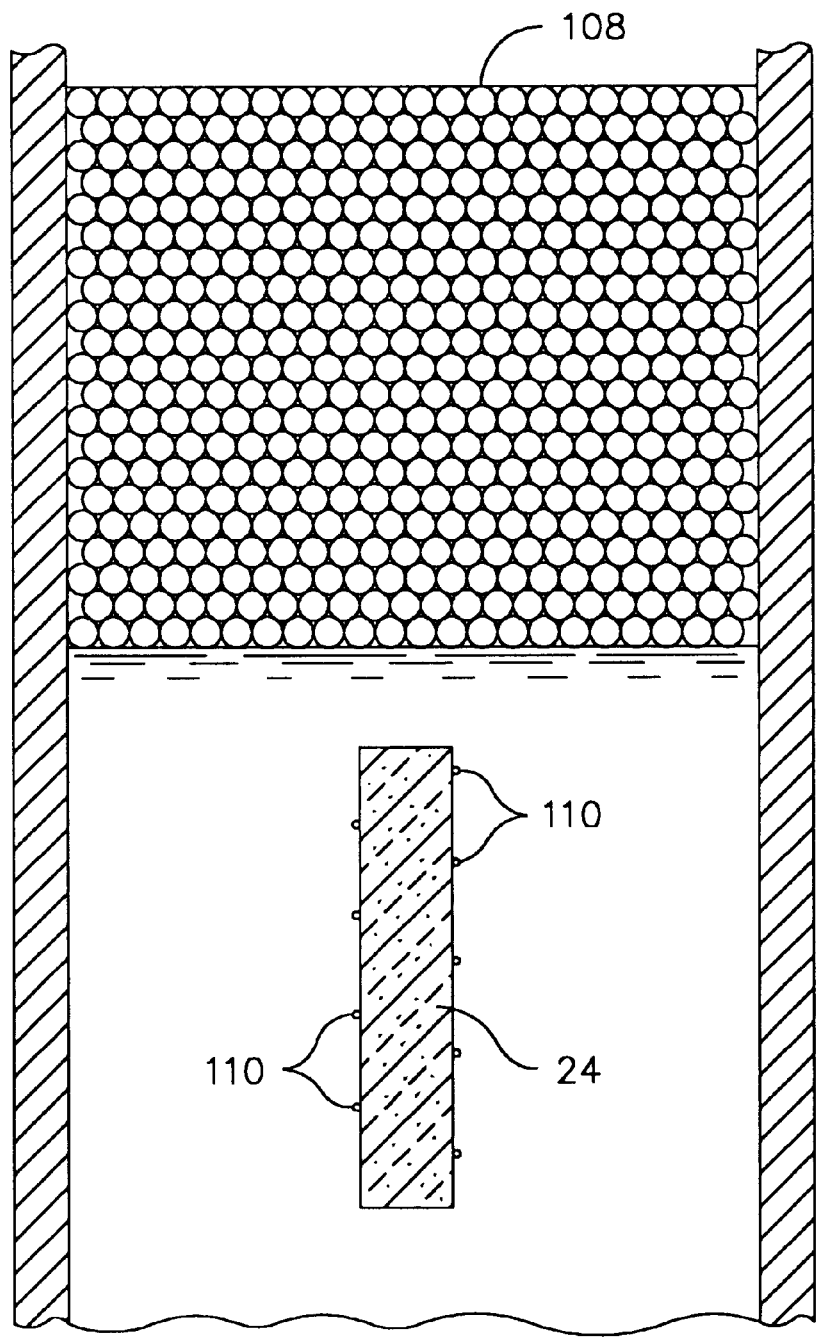
FIGS. 11–15 are schematic diagrams illustrating details of the drying process.
Figure 12:
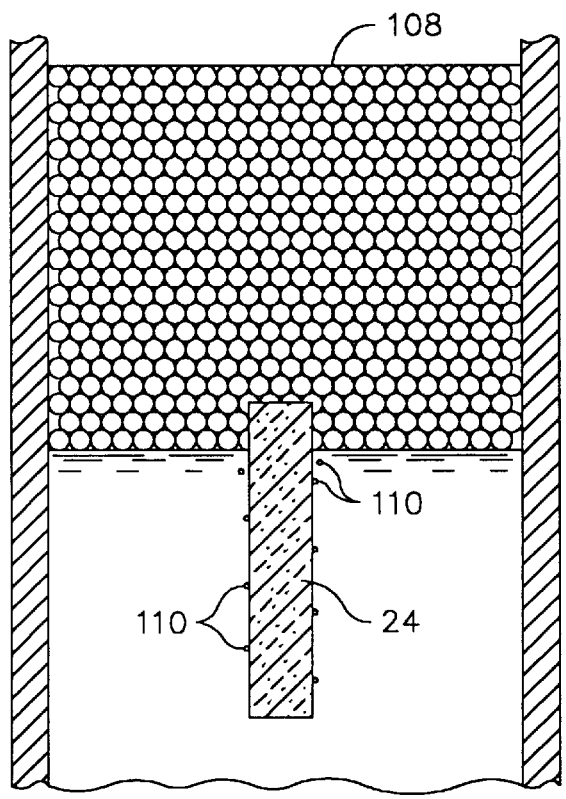
Figure 13:
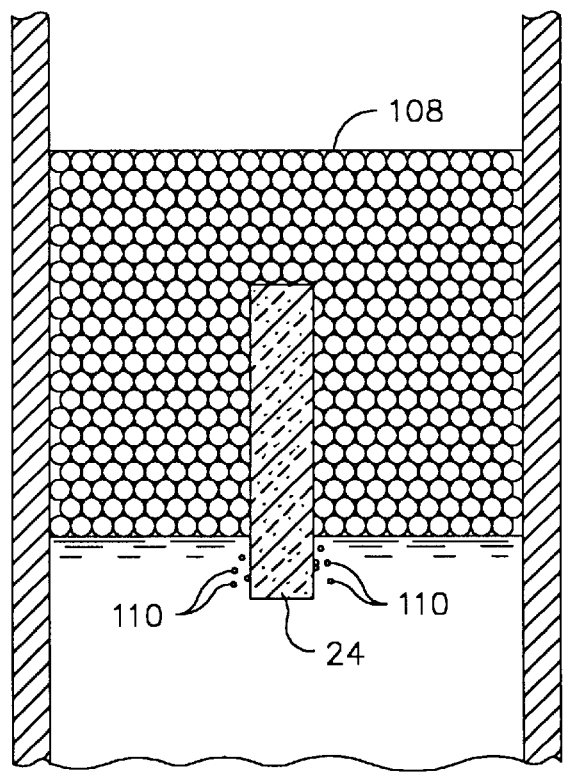
Figure 14:
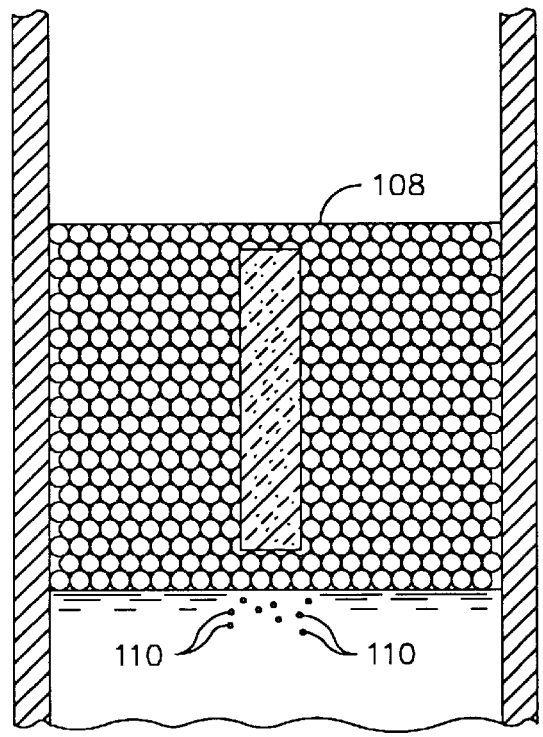
Figure 15:
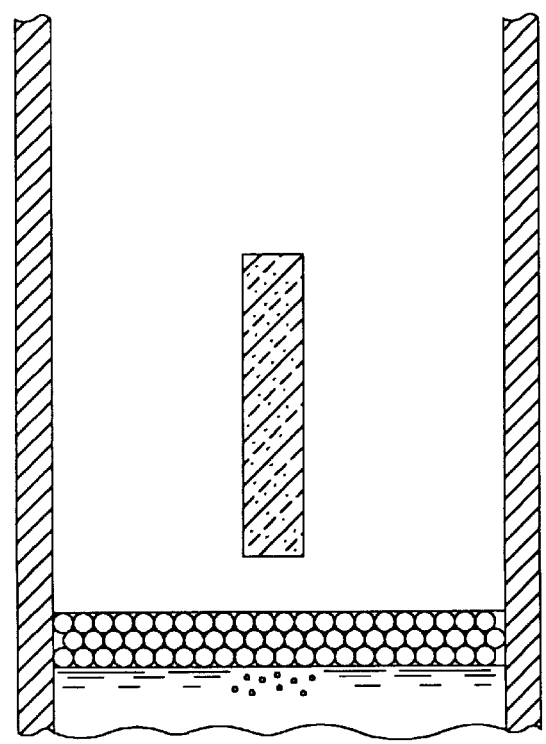

As shown in FIGS. 11–15, the foam layer scrubs particles from the surfaces of substrate 24 as it descends. In FIG. 11, the substrate is completely submerged in the carbon dioxide solution. Particles 110 are shown adhering to the surfaces of the substrate. As shown in FIGS. 12 and 13, the particles 110 are scrubbed by the interface of the foam layer and the carbon dioxide solution, and carried downward by the foam layer along the surfaces of the substrate so that they are removed from the substrate as shown in FIG. 14 and carried toward the bottom of the vessel.

Figure 16:
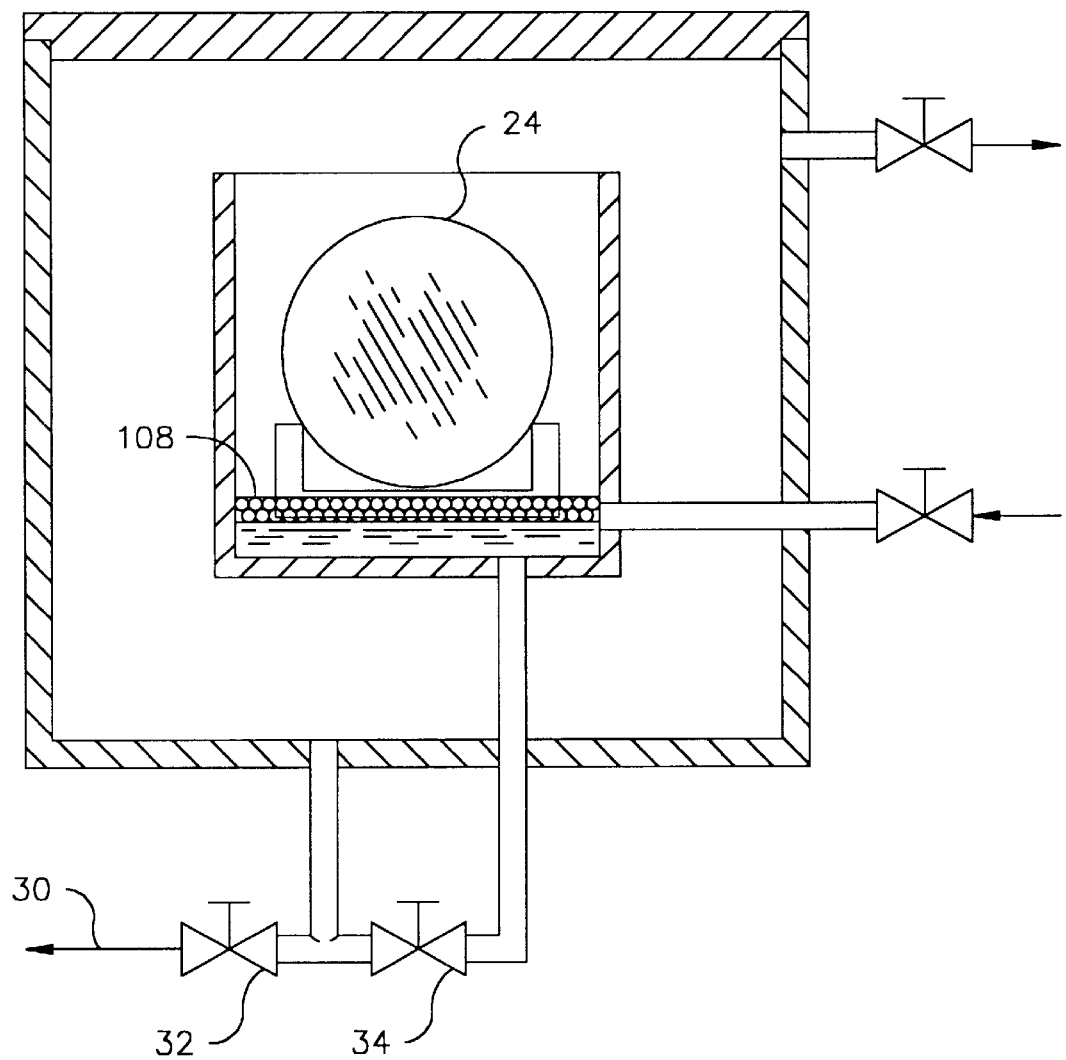
FIGS. 16 and 17 are schematic diagrams, corresponding to FIGS. 8–10, illustrating final stages of the drying process.
Figure 17:
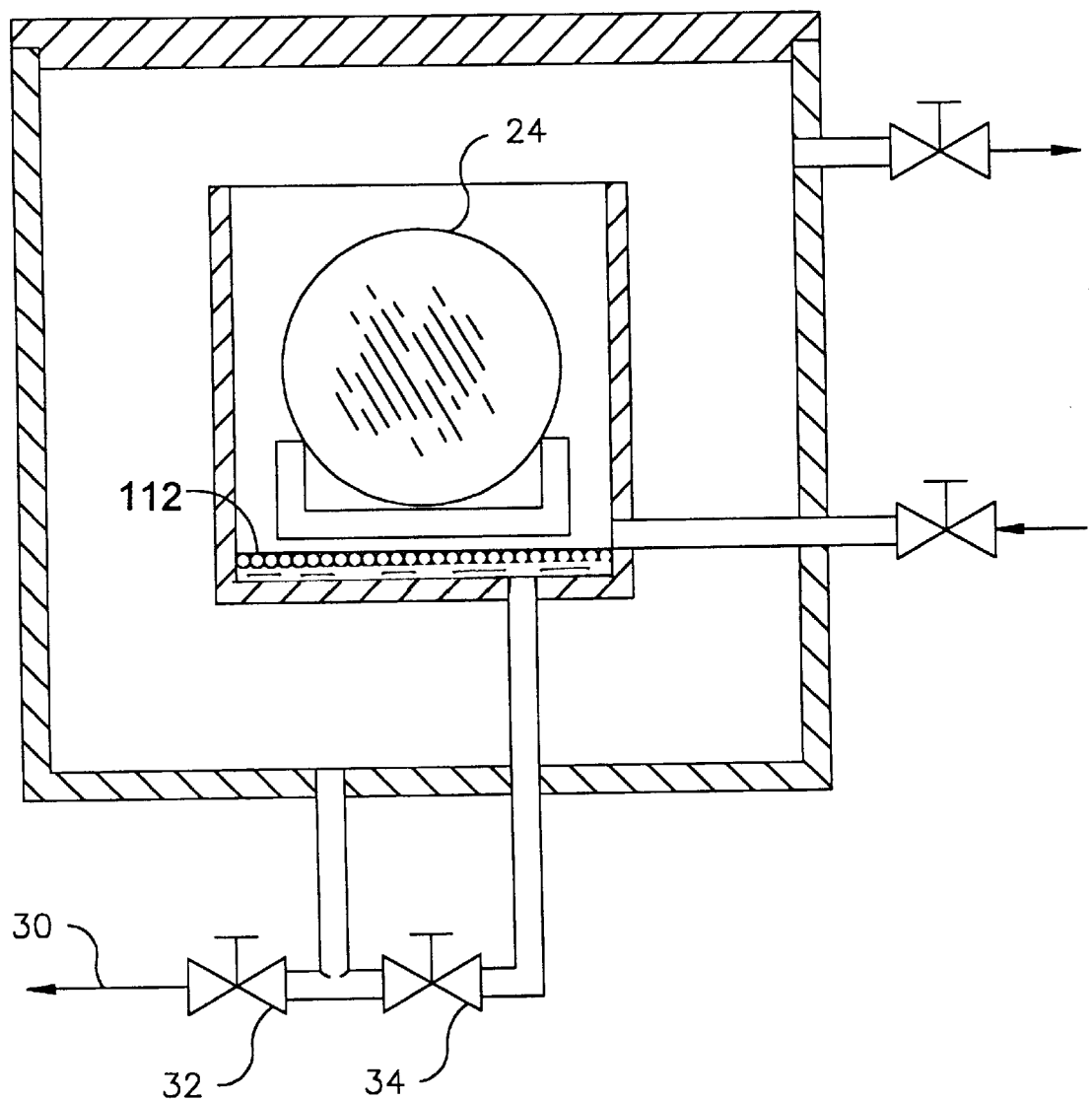

As the solution continues to be discharged from the vessel, the foam layer 108 clears the substrate, leaving the substrate in an atmosphere of carbon dioxide with some water vapor, as shown in FIG. 16. Ultimately, the foam layer 108 collapses leaving a residue 112 as shown in FIG. 17.

An example of a typical drying operation in accordance with the invention is as follows: The process starts with a frame carrying fifty 200 mm wafers, with 6 mm spacing, submerged in an overflow tank, i.e. vessel 18 in FIG. 8, within the drying unit containment vessel, i.e. vessel 22. The overflow tank contains, pure deionized water with either air or nitrogen as the overhead gas at atmospheric pressure or slightly above. The tank size is 25 cm (depth)×25 cm (width)×50 cm (length). Therefore, the volume is 31.25 liters without considering the volume of the carrying frame or the wafers. The wafers are about 100 cm$^3$ each, or 5000 cm$^3$ (5 liters) total, and the carrying frame is 1000 cm$^3$ (1 liter). Therefore, the liquid volume is 25.25 liters.

The containment vessel includes the necessary valves, check valve, pressure relief valves, baffles, channels, inlets, outlets, and access panels (doors, lids, etc.) to allow the process to operate safely at a total pressure of approximately 300 psig. To simplify calculations, assume that the total volume of the containment vessel is 30.00 liters. The external containment vessel is closed and prepared for pressurization.

The surface tension of $CO_2$ in water at 300 psig total pressure is between 57 dynes/cm at 11° C. and 59 dynes/cm at 45° C. This suggests that temperature is not an important variable, but that is misleading, since the solubility of $CO_2$ in water at 300 psig is very dependent upon the temperature. At 300 psig and 10° C. the solubility of $CO_2$ in water will produce a 4.5 weight percent solution. Since the $CO_2$ not only reduces the surface tension, but also generates the foam, the amount of $CO_2$ in the water is important, since the foam must be maintained during the liquid discharge interval.

In a separate adjacent vessel, suitably designed and equipped, and plumbed to the drying unit described above, pure deionized water is saturated with carbon dioxide at a pressure slightly higher than the 300 psig design pressure, and at a temperature about 10° C., yielding a concentration of carbon dioxide in water at 4.5 weight percent. The reason for the slight pressure increase is that the liquid will be pressure fed into the drying vessel, thereby eliminating the need for pumping systems which, in general, are sources of contamination due to their moving parts.

The pure deionized submersion water is replaced by equally pure deionized water containing carbon dioxide at 10° C. The atmospheric gas or nitrogen in the containment vessel is discharged and replaced with $CO_2$ while, at the same time, the total pressure of the system is increased to 300 psig. This step can be executed either of two ways. The dissolved $CO_2$ in the water can exchange with the air or nitrogen atmosphere, forming a new pressurized atmosphere of $CO_2$. Alternatively, the overhead atmospheric gas is displaced by direct injection of $CO_2$, purging the air or nitrogen while increasing the pressure within the containment vessel. The latter approach is desirable, because it is faster and produces less waste.

It is not necessary to eliminate every molecule of the original overhead gas. In general three displacement volumes are sufficient. The gas volume in the containment vessel is 30000 $cm^3$, which converts to 120,000 $cm^3$ $CO_2$ measured at STP (ignoring minor temperature differences). Since 44 grams of $CO_2$ occupy 22400 $cm^3$ at STP, the weight of $CO_2$ used is:

44×120000/22400=236 grams.

The pressure must be elevated to 20 atm, 300 psig, therefore requiring twenty times more $CO_2$:

236×20/1=4720 grams.

This procedure removes the overhead gas and pressurizes the containment vessel. The time interval required to carry out this operation is only about one minute, and therefore the amount of $CO_2$ adsorbed by the submersion water is not significant.

The next step is to displace the original submersion water. The carbon dioxide-saturated water in the storage tank is pressure fed into the containment vessel by a near quantitative displacement. It is not critical if some of the original submersion water is retained. This step requires 25.25 liters of water, 25250 grams, containing 4.5 wt % $CO_2$, or, 22250×0.045=1136 grams of $CO_2$.

The wafers are now submerged in a solution of carbon dioxide-saturated, deionized water. The surface tension of the solution is 57–59 dynes/cm. The overhead gas is carbon dioxide at 300 psig.

Quiescent, supersaturated solutions of carbon dioxide in water depend upon external forces to initiate the desorption process. Here, however, the carbon dioxide solution has no opportunity to become quiescent if, promptly after the carbon dioxide solution is introduced, depressurization of the outer vessel occurs. Depressurization initiates foaming, and the introduction of new carbon dioxide solution while the liquid level drops causes foaming to continue. Other measures, such as agitation, imparting turbulence to the incoming carbon dioxide solution, or the introduction of small amounts of nitrogen or other gas, can be used to ensure initiation of foaming, where necessary.

For the next step, assume that the carbon dioxide foam provides an expansion ratio of ten (E/R=10); a 100% drain time of 20 seconds; and an average foam thickness on the surface of 25.4 mm. The fluid-atmosphere interface descent rate, should be about 50–75 mm/minute. If the 250 mm depth of the overflow vessel is covered in 4 minutes, the average rate is 64 mm/minute.

The surface of the overflow tank is 200 $in^2$, so the volume of the foam required is 200 $in^3$ (3277 $cm^3$). The foam volume has to be maintained for the four minutes required for the venting of the containment vessel and the descent of the gas-liquid interface.

The venting can proceed linearly, and programmed depressurization can be accomplished by the declining liquid level and controlled overhead gas venting.

Since the foam volume needs to be maintained, the amount of carbon dioxide delivered to the drying unit has to be constant, but adjusted for the declining pressure. At 20 atmospheres, the carbon dioxide requirement is twenty times higher than at 1 atmosphere. The only source of carbon dioxide during this process interval is the saturated water solution stored in the adjacent tank.

The liquid level in the tank declines, but as this takes place, carbon dioxide and water are added so that the foaming of the carbon dioxide can maintain the foam blanket. Therefore, the carbon dioxide-water flow rate is defined by the amount of carbon dioxide required, while the liquid discharge rate from the vessel must accommodate the original liquid plus the added influent, while still maintaining a proper gas-liquid interface descent rate.

The system starts at 300 psig (315 psia) and declines to 0 psig (15 psia) in four minutes.

The following Table I, illustrates the conditions under which a constant volume of foam can be maintained as the liquid is discharged.

Column D lists the foam volume, which must be replaced during each 20-second interval. The foam volume is constant and is equal to the horizontal cross sectional area of the foam layer multiplied by its height. Column E collects the cumulative foam volume.

In Column F, the carbon dioxide volume portion of the foam, at pressure, is given. The expansion ratio of the foam is ten. Therefore, 90% of the foam volume is carbon dioxide, the expansion gas, while the balance is water. Column G accumulates Column F.

Column H converts the Column F data to carbon dioxide volume (cc.) at STP, without temperature adjustment. The pressure conversion is measured in absolute pressure, not gauge pressure, so the factor is: (15+P)/15. Column I is the cumulative carbon dioxide volume at STP in cubic centimeters.

Column J converts Column H into carbon dioxide by weight, using 22400 cc/mole as the standard molar volume and 44, the molecular weight of carbon dioxide. Column K is the cumulative carbon dioxide weight.

Columns L, M, N, and O show similar data for the water portion of the incoming feed stream. Since the carbon dioxide is 4.5 weight %, the water portion must be 95.5 weight %. Column L displays the 20-second interval data in grams, while Column M shows the cumulative data, converted to kilograms, without the carbon dioxide portion included. As will be apparent from columns N and O, the water flowrate decreases linearly over time.

TABLE I

DRYING VESSEL DISCHARGE DATA

PART 1

| | A TIME (sec) | B TIME (min) | C PRESSURE (psig) | D INTERVAL FOAM (cc) | E CUMULATIVE FOAM (cc) | F INTERVAL $CO_2$ GAS at P (cc) | G CUMULATIVE $CO_2$ GAS at P (cc) | H INTERVAL $CO_2$ GAS STP (cc) | I CUMULATIVE $CO_2$ GAS STP (cc) |
|---|---|---|---|---|---|---|---|---|---|
| 1 | 0 | 0.00 | 300 | 3277 | 3277 | 2949 | 2949 | 61935 | 61935 |
| 2 | 20 | 0.33 | 275 | 3277 | 6554 | 2949 | 5899 | 57020 | 118955 |
| 3 | 40 | 0.67 | 250 | 3277 | 9831 | 2949 | 8848 | 52104 | 171059 |
| 4 | 60 | 1.00 | 225 | 3277 | 13108 | 2949 | 11797 | 47189 | 218248 |
| 5 | 80 | 1.33 | 200 | 3277 | 16385 | 2949 | 14747 | 42273 | 260522 |
| 6 | 100 | 1.67 | 175 | 3277 | 19662 | 2949 | 17696 | 37358 | 297879 |
| 7 | 120 | 2.00 | 150 | 3277 | 22939 | 2949 | 20645 | 32442 | 330322 |
| 8 | 140 | 2.33 | 125 | 3277 | 26216 | 2949 | 23594 | 27527 | 357848 |
| 9 | 160 | 2.67 | 100 | 3277 | 29493 | 2949 | 26544 | 22611 | 280460 |
| 10 | 180 | 3.00 | 75 | 3277 | 32770 | 2949 | 29493 | 17696 | 398156 |
| 11 | 200 | 3.33 | 50 | 3277 | 36047 | 2949 | 32442 | 12780 | 410936 |
| 12 | 220 | 3.67 | 25 | 3277 | 39324 | 2949 | 35392 | 7865 | 418801 |
| 13 | 240 | 4.00 | 0 | 3277 | 42601 | 2949 | 38341 | 2949 | 421750 |

PART 2

| | A TIME (sec) | B TIME (min) | C PRESSURE (psig) | J INTERVAL $CO_2$ GAS WEIGHT (gm) | K CUMULATIVE $CO_2$ GAS WEIGHT (gm) | L INTERVAL WATER (gm) | M CUMULATIVE WATER (kgm) | N INTERVAL WATER FLOW (gm/sec) | O INTERVAL WATER FLOW (gpm) |
|---|---|---|---|---|---|---|---|---|---|
| 1 | 0 | 0.00 | 300 | 122 | 122 | 2704 | 2.70 | 141.3 | 2.24 |
| 2 | 20 | 0.33 | 275 | 112 | 234 | 2489 | 5.19 | 130.0 | 2.06 |
| 3 | 40 | 0.67 | 250 | 102 | 336 | 2274 | 7.47 | 118.8 | 1.88 |
| 4 | 60 | 1.00 | 225 | 93 | 429 | 2060 | 9.53 | 107.6 | 1.71 |
| 5 | 80 | 1.33 | 200 | 83 | 512 | 1845 | 11.37 | 96.4 | 1.53 |
| 6 | 100 | 1.67 | 175 | 73 | 585 | 1631 | 13.00 | 85.2 | 1.35 |
| 7 | 120 | 2.00 | 150 | 64 | 649 | 1416 | 14.42 | 74.0 | 1.17 |
| 8 | 140 | 2.33 | 125 | 54 | 703 | 1202 | 15.62 | 62.8 | 1.00 |
| 9 | 160 | 2.67 | 100 | 44 | 747 | 987 | 16.61 | 51.6 | 0.82 |
| 10 | 180 | 3.00 | 75 | 35 | 782 | 772 | 17.38 | 40.4 | 0.64 |
| 11 | 200 | 3.33 | 50 | 25 | 807 | 558 | 17.94 | 29.1 | 0.46 |
| 12 | 220 | 3.67 | 25 | 15 | 823 | 343 | 18.28 | 17.9 | 0.28 |
| 13 | 240 | 4.00 | 0 | 6 | 828 | 129 | 18.41 | 6.7 | 0.11 |

Ultimately, the drying vessel depressurization is complete and the vessel is empty, closed, and at atmospheric pressure. The atmosphere in the vessel is essentially all carbon dioxide as the vapor pressure of water at 10° C. is about 10 mm Hg., thereby defining that the partial pressure of carbon dioxide is 750 mm Hg. when the total pressure is one atmosphere or 760 mm Hg.

The entire vessel with its wafers and the supporting carriage will have some small amount of water remaining, particularly at the contact points where the wafers touch the carrying frame. That water, and any other within the vessel, can be removed by using carbon dioxide as a purging gas at room temperature for a few minutes, with the final carbon dioxide replaced with nitrogen, if desired. The dry carrier-supported wafers can then be removed from the drying equipment and stored or transported in an appropriate enclosure.

The following example illustrates a flow-through process analogous to the current, continuous phase, flow-through process in which deionized water is the medium and active ingredients are added as the chemical treatment process progresses. The treatment process begins with water, followed by etching, oxidizing, neutralization, each such step being followed by an intervening rinsing step, and finally drying at the end of the sequence.

In accordance with the invention, the same general sequence is executed using a foam medium. The expansion gas can be argon, air, or nitrogen, but nitrogen is preferred.

Instead of deionized water, the initial medium is deionized water with Wako Chemical NCW-601A surfactant, added as a foaming agent. The level of surfactant needs to be low, e.g. 300 ppm, enough to provide a fast drain time.

The wafers are placed in a flow-though system corresponding to the apparatus of FIG. 1, and foam is passed over them. In the first step, treatment with ammonium hydroxide and hydrogen peroxide, the "to-be-foamed" liquid (deionized water and surface tension-reducing agent) has the required amount of ammonium hydroxide and peroxide added. Foaming occurs, and the wafers are treated with this oxidizing solution. It is important that the foam has a fast drain time as it must produce a liquid phase of the desired composition. For example, if the desired solution requires 1000 ppm of hydrogen peroxide and 500 ppm of ammonium hydroxide, plus surface tension-reducing agent, in deionized water, then that solution is composed, foamed, and injected into the treatment vessel. The appropriately timed drainage provides the liquid phase composition to the surface of the wafer, but reduces the total volume of material required in proportion to the reciprocal of the expansion ratio.

After five minutes of treatment time, the hydrogen peroxide and the ammonium hydroxide injections are stopped, but the surface tension-reducing agent and deionized water continue. The foaming phase is now a rinsing phase utilizing only deionized water and surface tension-reducing agent.

This rinsing foam continues to pass through the treatment vessel until the previous reactants are flushed away.

The next sequence is an etching cycle, and the appropriate ingredients are added to the liquid before foaming, foaming occurs, treatment follows, the actives injection is stopped, and the rinsing cycle follows.

The third step follows in the same manner, as does the fourth, and fifth, if required, each ending with a rinsing phase.

Eventually, the chemical treatment is completed, and drying becomes the final step. The injection of surface tension-reducing agent into the water is stopped, the expansion gas injection is stopped, the foaming stops, and the system is converted to a liquid system, while the residual surface tension-reducing agent is flushed from the treatment vessel. This leaves the treatment vessel filled with deionized water, and the drying process can proceed. Carbon dioxide-saturated water, as described above, is injected into the now pressurized vessel, and the drying sequence continues.

It is important to recognize that all of the process variables, including fluid temperature and fluid composition, can be accommodated with a foam based system, simply by heating or cooling the incoming deionized water and injecting the proper levels of ingredients.

Various modifications can be made to the apparatus and processes described. For example, the cleaning and chemical treatments can take place either in the same vessels or in separate vessels, and the drying can take place in the same vessel in which cleaning and chemical treatment take place. Normally, the cleaning and chemical processing steps take place sequentially without any intermediate drying steps, and drying is carried out only as a final step when the wafers are to be removed from the treatment vessel. However, cleaning and chemical treatment steps may be carried out alternately with drying in the same vessel, especially when one or more of the chemical treatment steps is gas treatment.

Furthermore, as indicated previously, in the drying process, carbon dioxide can be introduced to purge the air, nitrogen or other atmosphere by introduction of carbon dioxide solution rather than by direct carbon dioxide injection. Still other modifications can be made without departing from the scope of the invention as defined by the following claims.

I claim:

1. A process for drying a substrate comprising the steps of:
supporting the substrate within a foam treatment vessel causing the supported substrate to be submerged in a solution of carbon dioxide in deionized water under pressure within said foam treatment vessel;
thereafter gradually reducing the pressure within the foam treatment vessel, thereby causing carbon dioxide bubbles to form a foam layer on the surface of the solution; and,
while gradually reducing the pressure within the foam treatment vessel, causing the foam layer to move relative to the substrate so that the substrate Passes through the foam layer, in moving contact therewith, into a gaseous atmosphere.

2. The process according to claim 1, in which the foam layer is caused to move relative to the substrate by gradually discharging the solution from the foam treatment vessel.

3. The process according to claim 1, in which the thickness of the foam layer is maintained substantially constant while the substrate passes through the foam layer.

4. The process according to claim 1, in which the foam layer is caused to move relative to the substrate by gradually discharging the solution from the foam treatment vessel, and in which the foam layer is maintained by addition of carbon dioxide to the solution within the foam treatment vessel as said solution is being discharged.

5. The process according to claim 1, in which the foam layer is caused to move relative to the substrate by gradually discharging the solution from the foam treatment vessel, and in which the foam layer is maintained by addition of deionized water containing dissolved carbon dioxide to the solution within the foam treatment vessel as said solution is being discharged.

6. The process according to claim 1, in which the foam treatment vessel is an inner vessel located within an outer, pressurizable, containment vessel, in which the solution of carbon dioxide in deionized water is contained within the inner vessel, and in which the foam layer is caused to move relative to the substrate by gradually discharging the solution from the inner vessel.

7. The process according to claim 1, in which, before causing the supported substrate to be submerged in a solution of carbon dioxide, the substrate is caused to be submerged in pure deionized water, and the step of causing the supported substrate to be submerged in a solution of carbon dioxide is carried out by displacing at least part of said pure deionized water by said solution.

8. The process according to claim 1, in which, before causing the supported substrate to be submerged in a solution of carbon dioxide, the substrate is caused to be submerged in pure deionized water, and the step of causing the supported substrate to be submerged in a solution of carbon dioxide is carried out by displacing at least part of said pure deionized water by pumping said solution into the foam treatment vessel under pressure.

9. The process according to claim 1, in which the foam treatment vessel is an inner vessel located within an outer, pressurizable, containment vessel, in which the solution of carbon dioxide in deionized water is contained within the inner vessel, and in which, before causing the supported substrate to be submerged in a solution of carbon dioxide, the substrate is caused to be submerged in pure deionized water, and the step of causing the supported substrate to be submerged in a solution of carbon dioxide is carried out by displacing at least part of said pure deionized water in the inner vessel by pumping said solution into the inner vessel under pressure.

10. The process according to claim 1, in which the foam layer is caused to move relative to the substrate gradually over a time interval, and in which the reduction of pressure within the foam treatment vessel takes place gradually throughout said time interval.

11. The process according to claim 1, in which the foam layer is caused to move relative to the substrate by gradually discharging the solution from the foam treatment vessel over a time interval, and in which the reduction of pressure within the foam treatment vessel takes place gradually throughout said time interval.

12. The process according to claim 1, in which the foam layer is caused to move relative to the substrate by gradually discharging the solution from the foam treatment vessel over a time interval, and in which the reduction of pressure within the foam treatment vessel is carried out at least in part by venting gas from said foam treatment vessel.

* * * * *

UNITED STATES PATENT AND TRADEMARK OFFICE
CERTIFICATE OF CORRECTION

PATENT NO. : 6,090,217
DATED : July 18, 2000
INVENTOR(S) : Paul A. Kittle

It is certified that error appears in the above-indentified patent and that said Letters Patent is hereby corrected as shown below:

Column 12, Table I, Part 1, line 9, column I, "280460" should read --380460--.

Column 13, line 56, "Passes" should read --passes--.

Signed and Sealed this

Third Day of April, 2001

Attest:

NICHOLAS P. GODICI

Attesting Officer

Acting Director of the United States Patent and Trademark Office